May 27, 1969 G. CHEROFF ETAL 3,445,924

METHOD FOR FABRICATING INSULATED-GATE FIELD EFFECT TRANSISTORS HAVING CONTROLLED OPERATING CHARACTERISTICS

Filed June 30, 1965

INVENTORS
GEORGE CHEROFF
FREDERICK HOCHBERG

BY S. P. Tedesco

ATTORNEY

United States Patent Office 3,445,924
Patented May 27, 1969

3,445,924

METHOD FOR FABRICATING INSULATED-GATE FIELD EFFECT TRANSISTORS HAVING CONTROLLED OPERATING CHARACTERISTICS

George Cheroff, Peekskill, and Frederick Hochberg, Yorktown Heights, N.Y., assignors to International Business Machines Corporation, Armonk, N.Y., a corporation of New York Filed June 30, 1965, Ser. No. 468,481
Int. Cl. H01g *13/00;* H01l *7/00*
U.S. Cl. 29—571 7 Claims

ABSTRACT OF THE DISCLOSURE

A method for fabricating electrical circuit components, field effect transistors, for example, in which the operating characteristics of the field effect devices are tailored by eliminating or passivating, surface traps along the conduction channel. A layer of an active metal, aluminum, for example, is deposited on the surface of an insulator, the latter being disposed in overlying relationship with the surface of a field effect transistor which has spaced source and drain regions. The active metal is disposed between the source and drain region. The transistor is subjected to heating for a time and temperature sufficient to passivate or eliminate surface traps. By heating for a temperature in a specified range, varying degrees of passivation can be attained. Where each of a plurality of devices requires a different operating characteristic, separate metallizations and heat treatments are carried out for each device. Heating in the absence of metallization does not alter the operating characteristic of the insulated gate field effect transistor.

At the present time, industry is directing much effort toward the development of techniques for batch-fabricating large numbers of electrical circuit components on a single semiconductor wafer. The objective of such development is to reduce the size, weight, and unit cost of the individual electrical circuit components. Also, such development includes the functional interconnection, or integration, of such electrical circuit components into operative arrangements to improve reliability and power utilization from the system viewpoint and, also, reduce the system package to a minimum.

An example of an electrical circuit component suitable for batch-fabrication is the insulated-gate field effect transistor. Basically, an insulated-gate field effect transistor comprises a metallic gate electrode spaced from the surface of a block, or wafer, of semiconductor material, e.g., of silicon (Si), by a thin insulating layer, e.g., of silicon dioxide ($SiO_2$); in addition, source and drain electrodes are defined by diffused spaced portions of opposite conductivity type in the surface of the semi-conductor wafer. Accordingly, the semiconductor wafer forms a constituent part of the insulated-gate field effect transistor in defining a conduction channel for majority carriers between the source and drain electrodes; in addition, the semiconductor wafer provides support for the insulated-gate field effect transistors formed on its surface. The operation of the insulated-gate field effect transistor closely approximates that of a vacuum tube triode since it is a voltage control device and "working currents" between source and drain electrodes are supported only by majority carriers. Conduction between the source and drain electrodes is effected by modulating the density of majority carriers along the conduction channel by electrical fields generated when the gate electrode is biased.

The insulated-gate field effect transistor is suitably adapted for batch-fabricating techniques in that source and drain diffusions are formed by a single diffusion step, the structure being completed by forming a thin insulating layer over the conduction channel in the semiconductor wafer surface and the subsequent metallization of the gate electrode. The fabrication process, therefore, is relatively simple as compared to processes for fabricating other solid-state electrical circuit components, e.g., the bipolar transistor, etc.; wherein numerous diffusion steps are required. Certain limitations, however, are inherent in known techniques for batch-fabricating insulated-gate field effect transistors. For example, under ideal conditions, insulated-gate field effect transistors formed concurrently on the semiconductor wafer exhibit identical operating characteristics. The ability to individually tailor the operating characteristics of such insulated-gate field effect transistors would simplify the layout and, also, the design of functional interconnections required to provide an operative circuit arrangement. For example, NPN insulated-gate field effect transistors fabricated by known techniques generally exhibit depletion mode operation, i.e., substantial source-drain current $I_{sd}$ flows at zero-gate bias; also PNP insulated-gate field effect transistors generally exhibit enhancement mode operation, i.e., negative-gate bias is required to draw useful source-drain current $I_{sd}$. Accordingly, insulated-gate field effect transistors of a same type, either NPN or PNP, formed on the semiconductor wafer exhibits the same operational mode, either "on" or "off," respectively. Cumbersome biasing techniques, therefore, are necessary to provide different operational modes for insulated-gate field effect transistors.

The characteristic operational modes exhibited by insulated-gate field effect transistors is usually governed by the density of donor-like surface states along the conduction channel. In addition, the presence of surface traps along the conduction channel limits the efficiency of the insulated-gate field effect transistor. For example, the operation of the insulated-gate field effect transistor is based upon electrical field-modulation of the mobile majority carrier density along the conduction channel. Gate electrode bias, in effect, increases the additional majority density along the conduction channel. The increase in majority carrier density per unit of gate electrode bias, however, is limited by the presence of surface traps which act as a sink for majority carriers induced into the conduction channel. Elimination, or passivation, of surface traps would increase the concentration of the mobile majority carriers per unit of gate electrode bias and, thus, increase the transconductance $g_m$ of the insulated-gate field effect transistor. Transconductance $g_m$ is defined by $dI_{sd}/dV_g$ and is proportional to the fraction of mobile majority carriers induced in the conduction channel which enter into the conduction band per unit of gate electrode bias $V_g$. If the number of majority carriers induced in the conduction channel per unit of gate electrode bias is represented by $n$, the expression is made that $n=n_c+n_t$, where $n_c$ and $n_t$ indicate the number of majority carriers which enter into the conduction band and which are absorbed by surface traps, respectively. When the quantity $n_c$ predominates, the transconductance $g_m$ is increased and useful source-drain current $I_{sd}$ is obtained for low values of gate electrode bias $V_g$. Also, increasing the number of donor-like surface states along the conduction channel would effectively increase the magnitude of source-drain current $I_{sd}$ that is obtained for a given gate electrode bias $V_g$. Accordingly, in the fabrication of insulated-gate field effect transistors, it is desirable that surface traps be eliminated and the density of donor states be controlled along the conduction channel whereby high values of transconductance $g_m$ and, also, source-drain current $I_{sd}$ at reasonable gate electrode bias $V_g$ are obtained. Moreover, the ability to positively control, on an individual basis, the density of donor-like surface states along the respective conduction channels of insulated-gate field effect transistors formed on the same semiconductor wafer would provide tailored operating characteristics which is desirable from the circuit designer's viewpoint.

Accordingly, an object of this invention is to provide a method for fabricating insulated-gate field effect transistors having an improved transconductance $g_m$.

Another object of this invention is to provide a novel method for tailoring the operating characteristics of an insulated-gate field effect transistor by controlling the density of donor surface states along the conduction channel.

Another object of this invention is to provide a novel method for individually tailoring the operating characteristics of a plurality of insulated-gate field effect transistors formed on a same semiconductor wafer.

In accordance with the particular aspects of this invention, the operating characteristics of an insulated-gate field effect transistor can be continuously tailored by subjecting that porton of the semiconductor wafer, e.g., of silicon, defining the conduction channel to a novel heat-metalization process. It has been observed that when such portion of the semiconductor wafer, e.g., of silicon, is oxidized and a thin layer of an active metal, hereinafter defined, is registered thereover, heating the semiconductor wafer at an elevated temperature, e.g., in excess of 250° C., substantially eliminates surface traps at the silicon dioxide-silicon interface whereby transconductance $g_m$ is increased; also, source-drain current $I_{sd}$ is further increased since additional donor-like surface states are created along the conduction channel. An active metal useful in the novel method of this invention is defined as one which is reactive with water ($H_2O$) and/or OH ions present in the silicon dioxide layer to produce free hydrogen ($H_2$). It appears that free hydrogen in the silicon dioxide insulating layer is effective to eliminate the surface traps at the silicon dioxide-silicon interface. The time required for passivation of surface traps appears to be singularly dependent upon the temperature of the heat-metalization process. The level at which source-drain current $I_{sd}$ saturates is dependent upon the number of effective donor-like surface states, i.e., the surface potential at the silicon dioxide-silicon interface, as determined by the temperature of the heat-metalization process. Accordingly, by proper selection of temperature, the operating characteristics of the insulated-gate field effect transistor can be tailored continuously in accordance with particular circuit requirements. It is known that the presence or donor-like states in the NPN insulated-gate field effect transistor structure can define a conductive path (inversion layer) between source and drain electrodes whereby such structure exhibits depletion mode operation. Similarly, in the PNP insulated-gate field effect transistor structure, the presence of donor-like states defines an accumulation layer between the source and drain electrodes such that, although a normally "off" device, a larger negative-gate bias than expected by theory is required to induce useful source-drain current $I_{sd}$. Controlling the number of donor-like surface states in accordance with this invention allows for the tailoring of the operating characteristics of insulated-gate field effect transistors, whether NPN or PNP.

It is an important aspect of this invention that temperatures employed during the heat-metalization process, when effected in air or inert atmosphere, do not alter the operating characteristics of the insulated-gate field effect transistor in the absence of metalization. Also, the operating characteristics of insulated-gate field effect transistors formed on a same semiconductor wafer can be tailored on an individual basis, for example, by subjecting selected transistors to successive and different heat-metalization processes. Also, a same result is achieved by providing metalization to each insulated-gate field effect transistor and elevating selected areas of the semiconductor wafer in turn to selected temperatures to impart the desired operating characteristics to the individual insulated-gate field effect transistors formed thereon.

Since the operating characteristics of insulated-gate field effect transistors formed on a same semiconductor wafer can be individually controlled, both "on" and "off" devices can be defined on a same semiconductor wafer by convential substrate biasing techniques. For example, in the case of NPN insulated-gate field effect transistors, selected transistors are treated to exihibit a greater depletion mode operation, i.e., are subjected to higher temperatures during the heat-metalization process, than other transistors which are subjected to lower temperatures during a different hear-metalization process. The semiconductor wafer, employed as an additional electrode, is biased to inhibit source-drain current $I_{sd}$ in the less-depleted insulated-gate field effect transistors but not to inhibit conducton in the more depleted insulated-gate field effect transistors. In numerous logical circuit arrangements, e.g., logical NOR it is advantageous to utilize a highly depleted, normally-"on" insulated-gate field effect transistor as load devices and normally-"off" insulated-gate field effect transistors as active circuit devices. The dual role of insulated-gate field effect transistors of a same type as both active devices and load devices in a logical circuit arrangement is highly desirable because of the resulting simplicity of the fabrication process.

A model is hereinafter set forth to describe the heat-metalization process wherein surface traps along the conduction channel in a field effect transistor are eliminated, or passivated, by the presence of free hydrogen ($H_2$) in the silicon dioxide ($SiO_2$) insulating layer. The model supposes a reaction between the active metal formed as a thin film over the insulating layer and OH ions normally present therein. The reaction between the active metal and OH ions in the insulating layer produces free hydrogen which migrates through the silicon dioxide layer to satisfy the surface traps whereby transconductance $g_m$ is increased. Also, subjecting the insulated-gate field effect transistor structures to elevated temperatures during the heat-metalization process appears to increase the density of donor-like surface states along the conduction channel whereby the magnitude of source-drain current $I_{sd}$ at zero-gate bias is increased. In the preferred method of the invention, aluminum (Al) metalization has been found to be more effective than other active metals, e.g., silver (Ag), gold (Au), molybdenum (Mo), etc. in reacting with the OH ions in the insulating layer. It has been observed that silver, gold, and molybdenum metalizations, in the given order, are effective to eliminate surface traps but with less efficiency than aluminum metalization. Accordingly, when such metalizations are employed, longer time duration and higher temperatures are required in the heat-metalization process; however, it has been observed that source-drain current $I_{sd}$ saturates at lower levels than when aluminum metalization is employed. The role of hydrogen is supported in the above model, in that, when the number of OH ions in the insulating layer is minimal, the heat-metalization process of this invention does not substantially affect the operating characteristics of the insulated-gate field effect transistor.

The foregoing and other objects, features, and advantages of the invention will be apparent from the following more particular description of preferred embodiments of the invention, as illustrated in the accompanying drawings.

In the drawings:

FIGS. 1A through 1K ilustrate the steps of the described process for fabricating a number of insulated-gate field effect transistors on a semiconductor wafer; the heat-metalization process for tailoring the operating characteristics of selected insulated-gate field effect transistors formed on the semiconductor wafer is particularly described with respect to FIG. 1H.

Figures 1, 2, 3:
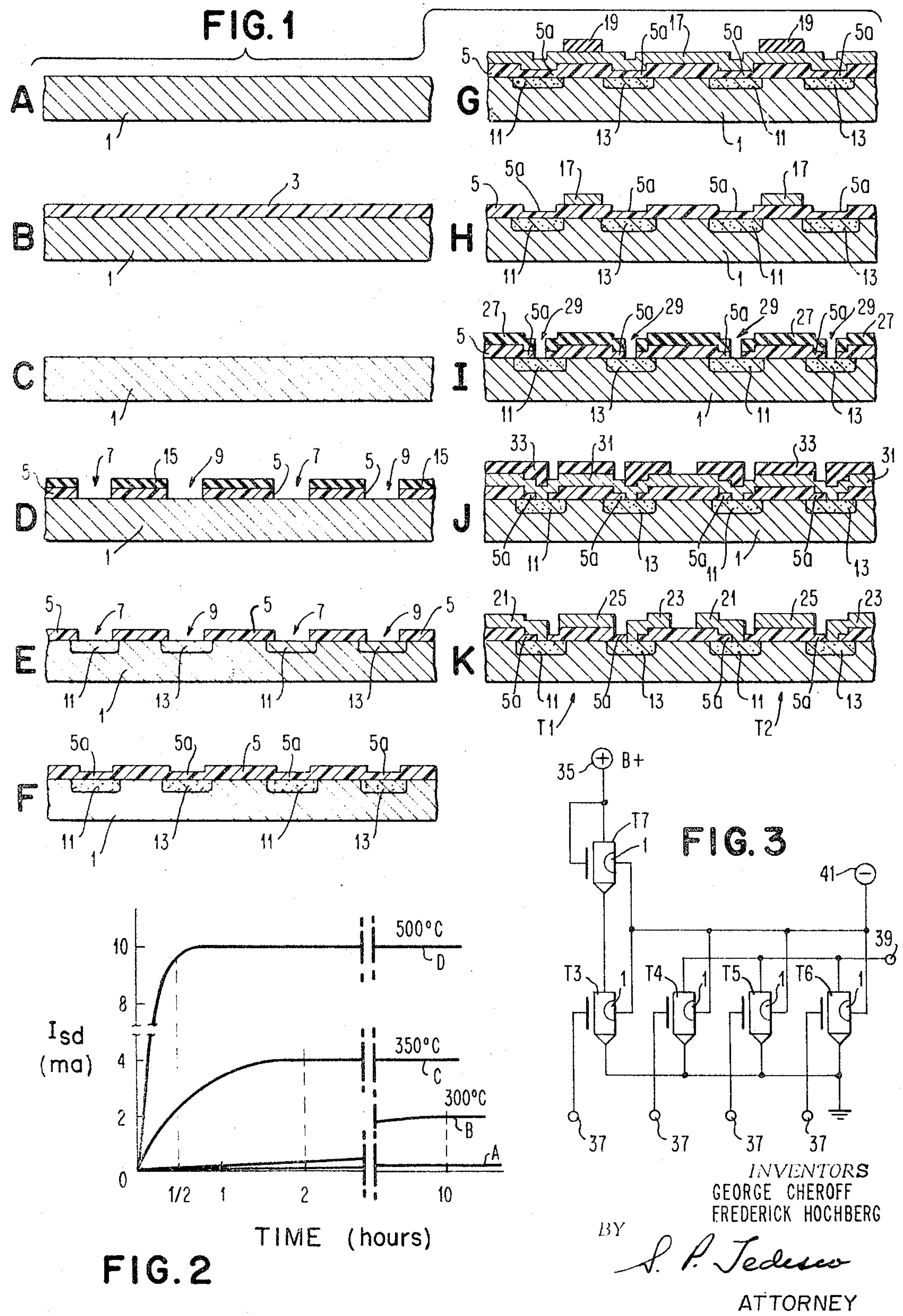
FIG. 2 is a series of curves which illustrate the effects of the heat-metalization process in tailoring the operating characteristics of an insulated-gate field effect transistor.
FIG. 3 is a schematic of a logical NOR circuit comprising insulated-gate field effect transistors which are utilized as both the load and active devices and whose operating characteristics have been tailored in accordance with this invention.

Referring to FIGS. 1A through 1K, the particular process steps for forming insulated-gate field effect transistors in accordance with this invention are illustrated. While the description of the novel process hereinafter set forth precisely describes particular solutions, temperatures, and other parameters, it should be obvious that numerous modifications thereof are available in the prior art and can be utilized without departing from the scope of this invention.

Referring to FIG. 1A, a fragmentary portion of a planar semiconductor wafer 1 is illustrated wherein a number of insulated-gate field effect devices T1 and T2 (c.f., FIG. 1K) are to be fabricated and individually tailored to exhibit desired operating characteristics. For purposes of description, wafer 1 is formed of p-type silicon material so as to form NPN type insulated-gate field effect transistors T1 and T2. Since conduction is primarily a surface mechanism, the operating characteristics of insulated-gate field effect transistors are materially affected by the surface condition of wafer 1, e.g., the presence of contaminates, surface traps, etc. Accordingly, the condition and reproducibility of the surface of wafer 1 is a critical aspect of the described method. It must be appreciated that reproducibility of semiconductor surfaces in the batch-fabrication of insulated-gate field effect transistors insures that insulated-gate field effect transistors batch-fabricated on different semiconductor wafers and treated in accordance with this invention exhibit controlled and identical operating characteristics.

The surface treatment of wafer 1 as illustrated in FIGS. 1A through 1C provides substantially reproducible surfaces. In FIG. 1A, wafer 1 which has been mechanically lapped and polished by conventional techniques, is subjected to a chemical polishing process which includes an initial washing in a petroleum ether bath which is ultrasonically agitated to insure removal of all grit and foreign surface contaminates. Wafer 1 is then cleaned in a 2% sodium hydroxide (NaOH) solution, such solution being frequently changed, and then rinsed in de-ionized water. Wafer 1 is chemically polished by immersion in a solution comprising 3 parts nitric acid ($HNO_3$); 1 part hydrofluoric acid (HF); and 2 parts glacial acetic acid ($CH_3COOH$). It is preferred that wafer 1 be rotated, say at 140 r.p.m. for 10 minutes, in the chemical polishing solution to insure uniform surface treatment. Subsequently, wafer 1 is rinsed thoroughly in de-ionized water and blown dry with filtered nitrogen ($N_2$). Wafer 1, if not to be processed immediately, can be stored in an isopropyl alcohol ($CH_3CHOHCH_3$) bath.

When wafer 1 is to be processed, it is removed from the isopropyl alcohol bath and rinsed in de-ionized water, for example, maintained at 80° C. and ultrasonically agitated for 10 minutes. Dipping in a hydrofluoric acid (HF) bath insures removal of all traces of the isopropyl alcohol. As shown in FIG. 1B, the cleaned wafer 1 is subjected to a first oxidation process to form a thin oxide layer 3. As hereinafter described, oxide layer 3 is not employed as an insulating layer in the final structure but, rather, is purposefully stripped, as shown in FIG. 1C, to provide improved and more reproducible surfaces. Oxide layer 3 is formed over the entire surface of wafer 1, for example, by a "dry-wet-dry" process which includes exposing such wafer at 960° C. successively to dry oxygen ($O_2$) for 15 minutes; steam ($H_2O$) for 90 minutes; and, again to dry oxygen ($O_2$) for 15 minutes. Alternatively, oxide layer 3 can be formed by a "dry" process by exposing wafer 1 at 1050° C. to dry oxygen ($O_2$) for approximately 16½ hours. The resulting oxide layer 3 has a thickness of approximately 6000 A. Stripping of oxide layer 3 is effected by immersing wafer 1 in a hydrofluoric acid bath for approximately 5 minutes, the wafer being rinsed in de-ionized water and blown dry with filtered nitrogen.

Stripping of oxide layer 3 described with respect to FIG. 1C provides a more positive control of the threshold voltage of insulated-gate field effect transistors. The surface condition of wafer 1 is apparently improved because of the gettering of surface impurities into the oxide layer 3 due to the high oxidation temperatures and, also, since a very thin surface portion of wafer 1 is consumed during the oxidation process. For example, it is known that the oxidation process occurs at the interface between the silicon dioxide layer being formed and the surface of a silicon wafer due to diffusion of the oxidizing atmosphere through the oxide layer; it does not appear that the crystalline silicon material diffuses outwardly toward the top of silicon dioxide layer during the oxidation process. Accordingly, a cleaner surface of wafer 1 is exposed upon stripping of oxide layer 3 and, also, it appears that the number of surface traps is reduced whereby a more positive control is had over the operating characteristics of the insulated-gate field effect transistors.

The fabrication of insulated-gate field effect transistors T1 and T2 is commenced by again subjecting wafer 1 to an oxidation process, substantially as hereinabove described, to form thin oxide layer 5 of a thickness range between 4000 A. and 7000 A. Oxide layer 5 is then photolithographically etched to define windows 7 and 9 for the diffusion of source and drain electrodes 11 and 13, respectively, to form field effect transistors T1 and T2. For example, as shown in FIG. 1D, a thin layer 15 of photoresist material, e.g., Kodak Photoresist, is spun over the surface of oxide layer 5 and photolytically reacted and developed to expose surface portions of oxide layer 5 wherein diffusion windows 7 and 9 are to be defined. Diffusion windows 7 and 9 are formed by immersing wafer 1 in a buffered hydrofluoric acid solution, for example, comprising 450 ml. of water ($H_2O$); 300 gm. of ammonium fluoride ($NH_4F$); and 75 ml. of hydrofluoric acid (HF), for a time sufficient to etch through oxide layer 5. Traces of the buffered hydrofluoric acid solution are removed by rinsing in de-ionized water. Photoresist layer 15 is removed by placing wafer 1 in a solution of 6% dicromate in sulphuric acid ($H_2SO_4$), wafer 1 again being subsequently rinsed and cleaned in de-ionized water. It is preferred that the resulting structure of FIG. 1D be blown dry with filtered nitrogen prior to effecting the source and drain diffusion step illustrated in FIG. 1E.

To form n-type source and drain electrodes 11 and 13, wafer 1 is exposed to a gaseous atmosphere of an appropriate impurity material, e.g., phosphorus pentoxide ($P_2O_5$), at an elevated temperature, e.g., between 1000° C. and 1300° C. With etched oxide layer 5 acting as a chemical mask, impurities diffuse into exposed surfaces of wafer 1 as shown in FIG. 1E. A post-diffusion clean-up of wafer 1 is had by washing in a de-ionized water bath maintained at approximately 80° C. and ultrasonically agitated for approximately 10 minutes. Wafer 1 is then subjected to a reoxidation-drive-in step, illustrated in FIG. 1F, in an atmosphere of dry oxygen at between 950° C. and 1150° C. The result is that impurities are driven further into wafer 1 and, also, thin oxide layers *5a* are formed within windows 7 and 9 and over diffused source and drain electrodes 11 and 13.

Subsequent to reoxidation, metalization for effecting the heat-metalization process is provided over conduction channels defined between correspoinding source and drain electrodes 11 and 13 for tailoring the operating characteristics of transistors T1 and T2 (c.f., FIG. 1K). As shown in FIG. 1G, a continuous metallic layer 17, for example, of aluminum, is vapor deposited over the surface of oxide layers 5 and *5a* and a second thin photoresist layer 19 is spun thereover. Photoresist layer 19 is photolytically reacted and developed to expose aluminum layer 17 but for portions registered over the conduction channels of transistors T1 and T2. The exposed portions of aluminum layer 17 are etched, for example, with a solution of 20% sodium hydroxide (NaOH). Photoresist layer 19 is then removed by appropriate solvents so as to obtain the structure shown in FIG. 1H, aluminum lands 17 being registered with the conduction channels of transistors T1 and T2.

As hereinafter more particularly described with respect to FIG. 2, heat treatment of wafer 1 in air at selected temperatures in the presence of aluminum lands 17 is effective to eliminate surface traps at the underlying surface of wafer 1; the particular temperatures to which wafer 1 is subjected, however, are ineffective to mitigate surface traps in the absence of metalization. By forming aluminum lands 17 over the now-defined conduction channels of transistors T1 and T2, the transconductance $g_m$ of such transistors is optimized; also, the operating characteristics of such transistors are individually tailored to different degrees by successive heat-metalization processes effected at selected temperatures. For example, with aluminum lands 17, as shown, wafer 1 is elevated to a selected temperature (c.f., FIG. 2) to subject each of transistors T1 and T2 to a first heat-metalization process whereby desired operating characteristics are provided, say, to transistor T1; subsequently, aluminum land 17 over the conduction channel of transistor T1 is stripped, by conventional techniques, and wafer 1 is elevated to a higher temperature to further deplete the operating characteristics only of transistor T2. Also, it is evident that aluminum lands 17 can be formed over the respective conduction channels of transistors T1 and T2 in turn and successive heat-metalization processes effected. If it is not desired to affect the operating characteristics of a particular insulated-gate field effect transistor formed on wafer 1, an aluminum land 17 is not provided over the corresponding conduction channel. By proper temperature selection during successive heat-metalization processes, the source-drain current $I_{sd}$ at zero-gate bias of transistors T1 and T2 can be precisely determined. Each heat-metalization process should be continued for a time sufficient to cause source-drain current $I_{sd}$ in each of transistor T1 and T2 to saturate as shown in FIG. 2. When successive heat-metalization processes have been completed, wafer 1 is again placed in an appropriate solution, hereinabove defined, so as to remove aluminum lands 17. Alternatively, aluminum lands 17 can be retained to serve as gate electrodes in the final structures of transistors T1 and T2.

The completed fabrication of transistors T1 and T2 is illustrated in FIGS. 1I through 1K wherein metalization defining source and drain contacts 21 and 23, respectively, and gate electrodes 25 of field effect transistors T1 and T2 (c.f., Fig 1K) are formed. As shown in FIG. 1I, photoresist layer 27 is spun over the surface of oxide layers 5 and *5a* and is photolytically reacted and developed to expose small surface areas of oxide layers *5a*. Openings 29 are etched through oxide layers *5a* to provide access for source and drain contacts 21 and 23 by placing wafer 1 in a hydrofluoric acid bath. When photoresist layer 27 is removed, a continuous layer 31, e.g., of aluminum, is then vapor deposited over oxide layers 5 and *5a* which extends through openings 29 and ohmically contacts source and drain diffusions 11 and 13. The final metalization pattern for integrating transistors T1 and T2 is formed in metallic layer 31 by conventional photoresist techniques. For example, a thin layer 33 of photoresist material is spun over the surface of metallic layer 31. Photoresist layer 33 is photolytically reacted and developed in the desired pattern of source and drain contacts 21 and 23, gate metalizations 25 and, also, necessary functional interconnections therebetween as shown in FIG. 1J. When photoresist layer 31 has been developed, wafer 1 is placed in aluminum-etch solution, hereinabove defined, whereby exposed portions of metallic layer 31 are removed and the final metalization pattern is defined. Since transistors T1 and T2 have been subjected to different heat-metalization processes, as described with respect to FIG. 1H, each exhibits different operational characteristics. As described, the operation of transistor T2 is more depleted than that of transistor T1 since the former has been subjected to a heat-metalization process at a more elevated temperature. However, the temperature to which each of transistors T1 and T2 are subjected during the successive heat-metalization processes, as described, are effective to substantially eliminate surface traps along the respective conduction channels whereby the transconductance $g_m$ of each is increased.

The heat-metalization process of this invention can be more fully appreciated by reference to FIG. 2 wherein the effects of different temperatures during a heat-metalization process on the operating characteristics of insulated-gate field effect transistors is graphically illustrated. The operating characteristics of an insulated-gate field effect transistor not subject to the heat-metalization process exhibits a source-drain current $I_{sd}$ at zero-gate bias illustrated by curve A of FIG. 2, greatly exaggerated. Albeit subjected to temperatures, for example, between 250° C. and 600° C. (c.f., FIGS. 1F and 1H), the operating characteristics of such device are essentially unchanged in the absence of metalization. However, when metalization, e.g., aluminum land 17, is provided over the conduction channel, source-drain current $I_{sd}$ at zero-gate bias is observed to saturate at a different level singularly determined by temperature. For example, source-drain current $I_{sd}$ can be varied continuously in excess of 10 ma. when the temperature of the heat-metalization process is in excess of 500° C. For example, as shown by curves B, C, and D of FIG. 2, source-drain current $I_{sd}$ at zero-gate bias is established at approximately 2 ma., 4 ma., and 10 ma. when treating temperatures are selected at 300° C., 350° C. and 500° C., respectively; in each instance, transconductance $g_m$ of the insulated-gate field effect transistor is increased. The duration of the heat-metalization process for saturating source-drain current $I_{sd}$ at zero-gate bias is related to the temperature of the heat-metalization process, a shorter duration being required at more elevated temperatures. In the practice, of this invention, it is preferred that the duration and temperature of the heat-metalization process is sufficient to insure saturation.

The heat-metalization effect hereinabove described is based upon the elimination of surface traps at the surface of wafer 1 underlying aluminum land 17 by the presence of free hydrogen in oxide layer 5, hydrogen being a reaction product between the aluminum and free OH ions present in the oxide layer 5. Accordingly, metalization employed during the heat-metalization process should be reactive with OH ions, i.e., water, to release free hydrogen. The elimination of surface traps by free hydrogen has been more particularly described in "Effects of Hydrogen Annealing on Silicon Surfaces," by P. Balk, presented at the Spring meeting of the Electrochemical Society, Sheraton Palace, San Francisco, Calif., May 9 through 13, 1965. Albeit the exact chemical reaction has not, as yet, been ascertained, aluminum is the preferred metalization as it appears to more easily react and release free hydrogen in the oxide layer 5. The effects observed when such aluminum metalization is employed are much more pronounced than effects achieved by either silver, gold, or molybdenum metalizations. A greater measure of control of the threshold voltages of field effect transistors subjected to the heat metalization process is observed when the metallic layer 17 is formed of aluminum. The time duration of heat-metalization processes when silver, gold, or molybdenum metalizations are employed is significantly longer while the resulting change in operating characteristics of the treated insulated-gate field effect transistors is not as pronounced.

The presence of free OH ions in the silicon dioxide layer 5 appears to be a necessary requirement for the practice of this invention and the quantity of such ions affects the degree to which the operating characteristics of the insulated-gate field effect transistors can be varied. For example, when oxide layer 5 is formed by a "dry" oxidation process, hereinabove described, and care is exercised to minimize the quantity of water present in the resulting oxide layer, the effects of the heat-metalization process on the operating characteristics of a treated insulated-gate field effect transistor are very substantially less than observed when the oxide layer is formed by a "dry-wet-dry" process, as hereinabove described, whereby the resulting oxide layer contains a larger quantity of water. Accordingly, the degree of tailoring which can be achieved by the heat-metalization process, as described, is related to the quantity of free OH ions, i.e., water, present in oxide layer 5 and, also, the selected temperature of such process.

To illustrate the advantages of this invention, a logical NOR circuit is illustrated in FIG. 3 wherein insulated-gate field effect transistors subjected to selective heat-metalization processes are employed both as load and active devices. As shown, transistors T3, T4, T5, and T6 are connected with source-drain circuits in parallel and define active devices. The source-drain circuit of transistor T7, adapted as the load device, is connected in series with the parallel arrangement of transistors T3 through T6. A positive voltage source 35 is connected to the drain electrode of load transistor T7, the drain electrode being commoned to the gate electrode to define a resistive load as known in the art. The source electrodes of active transistors T3 through T6 are multiplied to ground. Transistors T3 through T6 are formed on a same semiconductor wafer as represented by portions 1 in the bodies of the individual transistors.

To minimize power dissipation and also provide improved circuit stability, it is preferred that load transistor T7 be normally "on" whereas each of active transistors T3 through T6 be normally "off." During operation, the application of an information signal to at least one of the input terminals 37 connected to the corresponding gate electrode drives such transistor into conduction whereby the voltage at output terminal 39 is reduced and the logical NOR operator generated.

To fabricate the circuit of FIG. 3, successive heat-metalization processes are effected to provide desired operating characteristics to active transistors T3 through T6 and, also, load transistor T7. Preferably, load transistor T7 exhibits a more depleted operation than active transistors T3 through T6 whereby proper biasing of wafer 1 is effective to define both "on" and "off" devices on wafer 1. For example, during the fabrication process, aluminum lands 17 are provided over the respective conduction channels of transistors T3 through T7 (FIG. 1H). Accordingly, when wafer 1 is subjected to a selected temperature, say 350° C. for approximately 2 hours, the transconductance $g_m$ is increased due to the elimination of surface traps and the operating characteristics of each of the transistors T3 through T7 are tailored as illustrated by curve B of FIG. 2. To provide a more depleted operation to load transistor T7, aluminum lands 17 are removed from over active transistors T3 through T6 and load transistor T7 alone is subjected to a subsequent heat-metalization process at a more-elevated temperature, e.g., 500° C., to exhibit the operating characteristics illustrated by curve D of FIG. 2. Wafer 1, acting as an additional electrode of each of transistors T3 through T7, is connected to a negative voltage source 41; voltage source 41 is of sufficient magnitude to inhibit conduction in the less-depleted active transistors T3 through T6 but is insufficient to inhibit conduction in the more-depleted load transistor T7. Accordingly, during quiescent operation, active transistors T3 through T6 are normally "off" and load transistor T7 is normally "on" albeit batch-fabricated on wafer 1.

While the invention has been particularly shown and described with reference to preferred embodiments thereof, it will be understood by those skilled in the art that various changes in form and details may be made therein without departing from the spirit and scope of the invention.

What is claimed is:

1. A method for forming a plurality of insulated-gate field effect transistors on a semiconductor wafer of first conductivity type comprising the steps of providing a plurality of diffused spaced portions of opposite conductivity type in said wafer, corresponding spaced portions defining source and drain diffusions, respectively, of said transistors, forming a thin insulating layer at least over surface portions of said wafer intermediate said corresponding spaced portions and defining the conduction channels of said transistors, forming thin layers of an active metal on said thin insulating layer formed over and overlying said conduction channels, heating said wafer at a first temperature in a given range of temperatures which modifies the electrical characteristics of the channel to a desired extent whereby the operating characteristics of said individual transistors are tailored by a first amount, removing selected ones of said thin metallic layers from over said conduction channels of selected ones of said transistors, heating said wafer to a second more elevated temperature in said given range of temperatures which in turn modifies the remaining metal-covered channels to a further desired extent whereby the operating characteristics of others of said selected transistors are tailored by a second amount, and functionally interconnecting said individual field effect transistors in operative circuit arrangement.

2. The method of claim 1 wherein said wafer is formed of silicon, said insulating layer is silicon dioxide, and said active metal is one selected from the group consisting of aluminum (Al), silver (Ag), gold (Au), and molybdenum (Mo).

3. The method of claim 1 wherein said wafer is formed of silicon, said insulating layer is silicon dioxide, said thin metallic layer is aluminum, and said given temperature range is 300° C. to 500° C.

4. A method for forming a plurality of insulated-gate field effect transistors on a semiconductor wafer of first conductivity type comprising the steps of diffusing spaced portions of opposite conductivity type in said wafer, corresponding spaced portions defining source and drain diffussions, respectively, of said transistors, forming a thin insulating layer at least over surface portions of said wafer intermediate said corresponding spaced portions and defining the conduction channels of said transistors, forming first thin layers of an active metal on said insulating layer formed over an overlying said conduction channels of selected ones of said transistors, heating said wafer to a first elevated temperature in a given range of temperatures which modifies the electrical characteristics of the channel to a desired extent whereby the operating characteristics of said selected transistors are tailored by a first amount, removing said first thin metallic layers, forming second thin layers of an active metal over said insulating layer formed over and overlying said conduction channels of others of said transistors, heating said wafer to a second elevated temperature in said given range of temperatures which modifies the electrical characteristics of the channels of said others of said transistors to a further desired extent whereby the lying said conduction channels of others of said transistors, ther tailored by a second amount, and functionally interconnecting said field effect transistors in operative circuit arrangement.

5. The method of claim 4 wherein said wafer is formed of silicon, said insulating layer is silicon dioxide, said first and said second metallic layers are aluminum, and said wafer is heated at a temperature in the range of 300° C. to 500° C.

6. A method for forming a plurality of insulated-gate field effect transistors on a semiconductor wafer comprising the steps of: providing a plurality of source, drain and gate portions in said semiconductor wafer, forming a thin insulating layer at least over the surface of said gate portions, forming first thin layers of an active metal on said insulating layer formed over and overlying said gate portions of selected ones of said transistors, heating said wafer to a first elevated temperature in a given range of temperatures which modifies the electrical characteristics of the gate portion to a desired extent whereby the operating characteristics of said selected transistors are tailored by a first amount, removing said first thin metallic layers, forming second thin layers of an active metal over said insulating layer formed over and overlying said gate portions of others of said transistors, heating said wafer to a second elevated temperature in said given range of temperatures which modifies the electrical characteristics of the gate portion of said others of said transistors to a desired extent whereby the operating characteristics of said other transistors are further tailored by a second amount, and functionally interconnecting said field effect transistors in operative circuit arrangement.

7. A method for forming a plurality of insulated gate field effect transistors on a semiconductor wafer comprising the steps of: providing a plurality of source, drain and gate portions in said semiconductor wafer, forming a thin insulating layer at least over the surface of said gate portions, forming a thin layer of an active metal on said thin insulating layer formed over and overlying said gate portions, heating at least one of said plurality of source, drain and gate portions to a first temperature which modifies the electrical characteristics of the surface to a desired extent whereby the operating characteristics of said individual transistors are tailored by a first amount and heating source, drain and gate portions different from said at least one of said plurality of source, drain and gate portions to other temperatures different from said first temperature which in turn modifies said different source, drain and gate portions to further desired extents whereby the operating characteristics of other of said individual transistors are tailored by different amounts, and functionally interconnecting said individual field effect transistors in an operative circuit arrangement.

References Cited

UNITED STATES PATENTS

| | | |
|---|---|---|
| 3,056,888 | 10/1962 | Atalla. |
| 3,311,756 | 3/1967 | Nagata et al. |

WILLIAM I. BROOKS, *Primary Examiner.*

U.S. Cl. X.R.

29—574, 578; 148—1.5; 17—235